(12) United States Patent
Mizuguchi et al.

(10) Patent No.: US 7,995,386 B2
(45) Date of Patent: Aug. 9, 2011

(54) APPLYING NEGATIVE GATE VOLTAGE TO WORDLINES ADJACENT TO WORDLINE ASSOCIATED WITH READ OR VERIFY TO REDUCE ADJACENT WORDLINE DISTURB

(75) Inventors: Yuji Mizuguchi, Santa Clara, CA (US); Mark W. Randolph, San Jose, CA (US); Darlene Gay Hamilton, White Salmon, WA (US); Yi He, Fremont, CA (US); Zhizheng Liu, San Jose, CA (US); Yanxia (Emma) Lin, San Jose, CA (US); Xianmin Yi, Santa Clara, CA (US); Gulzar Kathawala, Santa Clara, CA (US); Amol Ramesh Joshi, Sunnyvale, CA (US); Kuo-Tung Chang, Saratoga, CA (US); Edward Franklin Runnion, San Jose, CA (US); Sung-Chul Lee, Cupertino, CA (US); Sung-Yong Chung, Davis, CA (US); Yanxiang Liu, Sunnyvale, CA (US); Yu Sun, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 340 days.

(21) Appl. No.: 12/275,663

(22) Filed: Nov. 21, 2008
(Under 37 CFR 1.47)

(65) Prior Publication Data
US 2010/0128521 A1 May 27, 2010

(51) Int. Cl.
*G11C 16/04* (2006.01)

(52) U.S. Cl. .............................. 365/185.02; 365/185.17
(58) Field of Classification Search ............. 365/185.02, 365/185.17, 185.18
See application file for complete search history.

(56) References Cited

U.S. PATENT DOCUMENTS

| 7,257,024 | B2 * | 8/2007 | Rudeck et al. | 365/185.02 |
| 7,286,408 | B1 * | 10/2007 | Higashitani | 365/185.19 |
| 7,636,257 | B2 * | 12/2009 | Lue | 365/185.18 |

* cited by examiner

*Primary Examiner* — Vu A Le
(74) *Attorney, Agent, or Firm* — Turocy & Watson, LLP

(57) ABSTRACT

Systems, methods, and devices that facilitate applying a predefined negative gate voltage to wordlines adjacent to a selected wordline associated with a memory cell selected during a read or verify operation to facilitate reducing adjacent wordline disturb are presented. A memory component can comprise an optimized operation component that can apply a predefined negative gate voltage to wordlines adjacent to a selected wordline associated with a memory cell selected for a read or verify operation, based at least in part on predefined operation criteria, to facilitate reducing adjacent wordline disturb in the selected memory cell to facilitate reducing a shift in the voltage threshold and maintain a desired operation window. The optimized operation component optionally can include an evaluator component that can facilitate determining whether a negative gate voltage applied to adjacent wordlines is to be adjusted to facilitate reducing adjacent wordline disturb below a predetermined threshold amount.

20 Claims, 11 Drawing Sheets

US 7,995,386 B2

APPLYING NEGATIVE GATE VOLTAGE TO WORDLINES ADJACENT TO WORDLINE ASSOCIATED WITH READ OR VERIFY TO REDUCE ADJACENT WORDLINE DISTURB

TECHNICAL FIELD

The subject innovation relates generally to memory systems and in particular, to systems, methodologies, and devices that can facilitate applying a negative gate voltage to wordlines that are adjacent to a wordline associated with a memory cell(s) during a read or verify operation to facilitate reducing adjacent wordline disturb.

BACKGROUND

A wide variety of memory devices can be used to maintain and store data and instructions for various computers and similar systems. In particular, flash memory is a type of electronic memory media that can be rewritten and retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and/or NAND flash, for example. NOR flash evolved from electrically erasable read only memory (EEPROM) chip technology, in which, unlike flash, a single byte can be erased; and NAND flash evolved from DRAM technology. Flash memory devices can be less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory can be used in many portable electronic products, such as cellular phones, computers, voice recorders, thumbnail drives, and the like, as well as in many larger electronic systems, such as automobiles, airplanes, industrial control systems, etc. The fact that flash memory can be rewritten as well as its retention of data without a power source, small size and light weight have all combined to make flash memory devices a useful and popular means for transporting and maintaining data.

Flash memory typically comprises an array of nonvolatile memory cells wherein data (e.g., one or more bits of data) can be stored. One type of flash memory comprises multi-level memory cells (e.g., quad-level memory cells) where each level can be associated with a respective data state. The multi-level memory cells also can comprise more than one memory element in which data can be stored. For example, a quad-level flash memory cell can comprise two memory elements that each can be programmed to four levels resulting in a memory cell that can have sixteen available data states and can store four bits of data. Each level of a multi-level memory cell can have a respective region or window that is associated with a respective data state.

Typically, memory cells can be formed in an array comprising wordlines (WLs) and bitlines (BLs) formed into an array, where memory cells can be located at points where the WLs and BLs intersect. The WLs can be respectively connected with gates of memory cells, and the respective drains and sources of memory cells can be connected with respective BLs. To perform operations, such as program, read, verify, or erase, on memory cells, a desired gate voltage, drain voltage, and source voltage can be applied to a memory cell via the WL and BLs, respectively, to effect the desired operation.

As density of memory devices have increased, spacing between adjacent WLs has become more narrow and the width of WLs has become more narrow. As a result, during read and verify operations when a WL and associated memory cell is selected for the read or verify operation, WLs adjacent to the WL selected can cause bit disturb to the selected memory cell, as it can shift the threshold voltage (Vt) and drain-source current ($I_{ds}$) of the selected memory cell, based in part on the programming state of the adjacent memory cells associated with the adjacent WLs. For instance, when the adjacent memory cells are programmed, an undesirable electric field can be generated by the adjacent WLs, based in part on the programmed state of the adjacent memory cells, and this undesirable electric field can reach the selected WL and/or associated selected memory cell and can cause a shift in the Vt and narrow the operation window of the selected memory cell. Also, during a read or verify operation associated with a selected memory cell and WL, when the adjacent memory cells are not programmed (e.g., in an erase state), an undesirable fringing current can flow under and outside the selected WL, and this undesirable fringing current can cause a shift in the Vt (and a corresponding shift in the drain-source current ($I_{ds}$)) and narrow the operation window of the selected memory cell. It is desirable to efficiently minimize or reduce adjacent wordline disturb and maintain a desirable operation window in memory cells.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems, methods, and devices that can optimize performance of read and verify operations in a memory component by applying negative gate voltages to wordlines (WLs) adjacent to a wordline (WL) associated with a memory cell on which a read or verify operation is being performed. In one aspect, the memory component can comprise a nonvolatile memory array(s) (e.g., flash memory array) that can contain a plurality of memory cells (e.g. multi-bit, multi-level memory cells) in which data can be stored. In the memory array, memory cells can be respectively associated with WLs and bitlines (BLs) that can be selected and respective voltages can be applied thereto, as desired, to facilitate performing program, read, verify, and/or erase operations on desired memory cells. Each memory cell can comprise a gate, drain, and source, where the gate can be connected to a WL and the drain and source can be connected to respective and adjacent BLs. A predefined gate voltage can be applied to a gate, a predefined drain voltage can be applied to a drain, and a predefined source voltage can be applied to a source, of a memory cell to facilitate performing a desired operation on the memory cell, where the respective voltages can be determined based at least in part on the type of operation being performed on the memory cell.

In an aspect, the memory component can include an optimized operation component that can facilitate applying a predefined negative gate voltage to WLs adjacent to a WL associated with a memory cell selected for a read or verify operation to facilitate minimizing or reducing adjacent WL disturb in the selected memory cell and improving or maintaining the operation window of the selected memory cell. During a read or verify operation associated with a selected memory cell, when the adjacent WLs are associated with memory cells that are programmed to a specified data state, applying the negative gate voltage to the adjacent WLs during the read or verify of the selected memory cell can reduce or minimize an undesirable fringing electric field generated by the adjacent WLs, which can facilitate reducing or minimizing adjacent WL disturb, and this can facilitate reducing an undesirable shift in the Vt of the selected memory cell and improving or maintaining the operation window of the selected memory cell. In another aspect, during a read or verify operation associated with a selected memory cell, when the adjacent WLs are associated with memory cells that are not programmed (e.g. memory cells are in an erase state), applying the negative gate voltage to the adjacent WLs can reduce or minimize undesirable fringing current flowing from the selected WL (e.g., associated with the selected memory cell) towards the adjacent WLs, due in part to the unprogrammed state of the memory cells associated therewith, which can reduce or minimize adjacent WL disturb thereby facilitating reducing an undesirable shift in the Vt of the selected memory cell and improving or maintaining the operation window of the selected memory cell. The voltage level of the predefined negative gate voltage applied to WLs adjacent to a selected WL during a read or verify operation associated with a selected memory cell can be based at least in part on predefined operation criteria, which can include, for example, type of memory cell, number of memory elements in the memory cell, number of available data levels for each memory element in the memory cell, type of operation being performed on a selected memory cell, spacing between WLs, width of WLs, whether adjacent WLs are associated with programmed memory cells, whether the adjacent WLs are associated with unprogrammed memory cells, etc.

In accordance with still another aspect, methods that can facilitate applying a negative gate voltage to WLs adjacent to a selected WL associated with a memory cell selected for a read or verify operation to facilitate reducing adjacent WL disturb are presented. In yet another aspect, an electronic device that can comprise a memory component that can employ an optimized operation component to facilitate applying a negative gate voltage to WLs adjacent to a selected WL associated with a memory cell selected for a read or verify operation to facilitate reducing adjacent WL disturb is presented.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
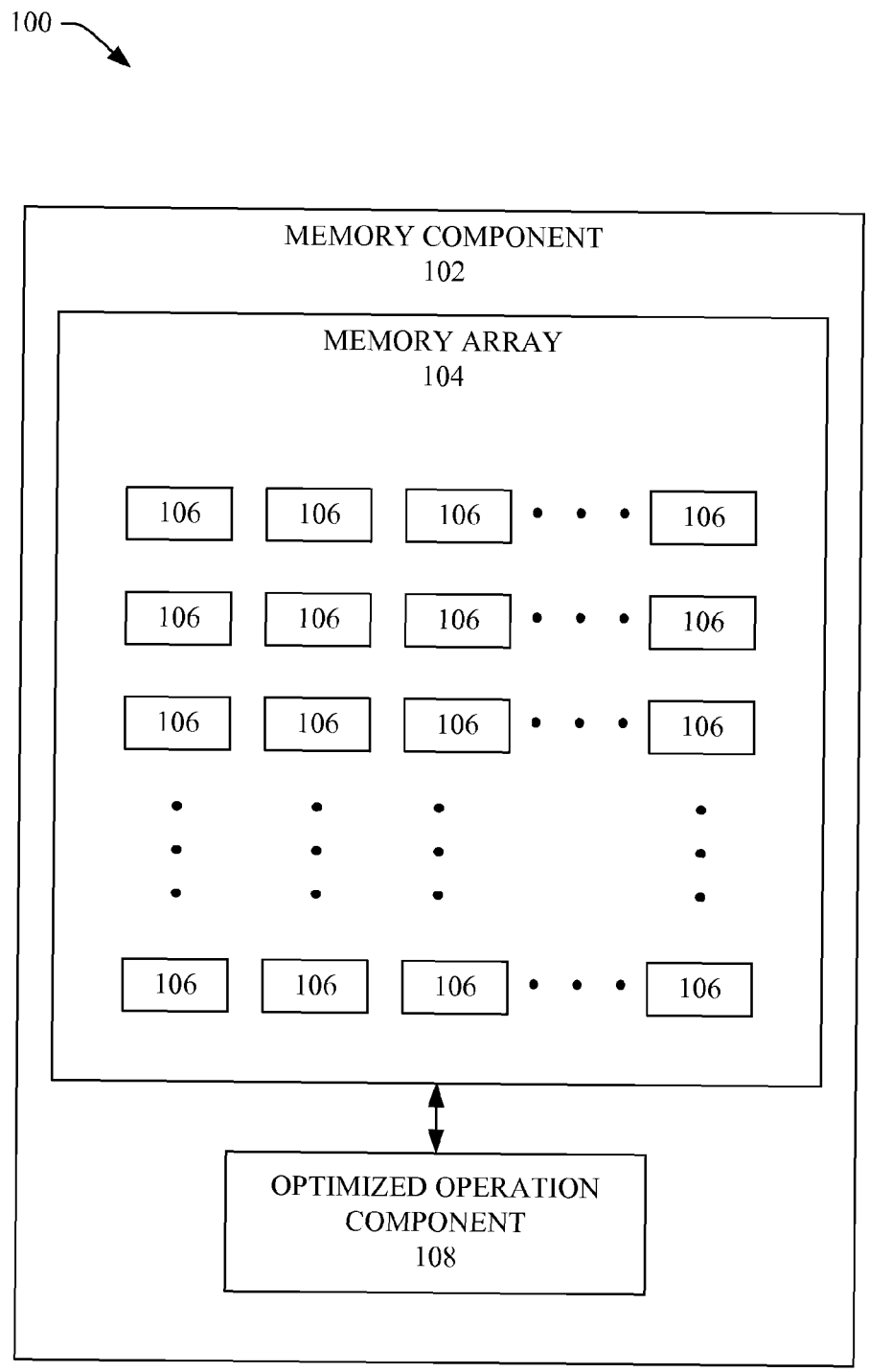
FIG. 1 illustrates a block diagram of a system that can facilitate refresh of data associated with a memory component in accordance with various aspects and embodiments of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, certain memory devices (e.g., multi-level flash memory) can contain a memory array comprised of wordlines (WLs) and bitlines (BLs), where memory cells can be located at the points where respective WLs cross respective BLs. As memory devices have been scaled down and density of memory devices has increased, spacing between WLs decreased and the width of WLs has decreased to facilitate increased data storage and/or smaller packaging. The decreased space between adjacent WLs and decreased WL width has resulted in an undesirable increase in adjacent WL disturb, where certain parameter levels (e.g. voltage level of the adjacent WLs, electric field generated by adjacent WLs and/or memory cells associated therewith) of WLs adjacent to a selected WL associated with a memory cell selected for certain memory operations (e.g., read operation, verify operation) can cause a disturb (e.g. undesirable shift in threshold voltage (Vt) associated with a data state) on the selected memory cell (e.g., via the selected WL associated therewith), which can negatively impact memory operations and decrease the operation window of the selected memory cell. It is desirable to minimize or reduce adjacent wordline disturb during read and/or verify operations as well as maintain a desirable operation window in memory cells.

Systems, methods, and devices that facilitate applying a predefined negative gate voltage to WLs adjacent to a selected WL associated with a memory cell selected during a read or verify operation to facilitate reducing adjacent WL disturb are presented. A memory component can comprise an optimized operation component that can apply a predefined negative gate voltage to WLs adjacent to a selected WL associated with a memory cell selected for a read or verify operation, based at least in part on predefined operation criteria, to facilitate reducing adjacent WL disturb in the selected memory cell to facilitate reducing a shift in the Vt and maintain a desired operation window. The optimized operation component optionally can include an evaluator component that can facilitate determining whether a negative gate voltage applied to adjacent WLs is to be adjusted to facilitate reducing adjacent WL disturb below a predetermined threshold amount.

FIG. 1 illustrates a block diagram of a system 100 that can facilitate refresh of data associated with a memory component in accordance with various aspects and embodiments of the subject matter disclosed herein. System 100 can include a memory component 102 that can be comprised of a memory array(s) 104 that can store data, operation code, commands, etc., in individual memory cells 106 in the memory array 104. For instance, in a memory array 104, there can be R memory cells 106, where R can be a desired integer number. Each memory cell 106 can store one or more bits of data (e.g., memory cell having two data states; memory cell having two memory elements that each can employ two data states; multi-level, multi-bit memory cell). In yet another aspect, the memory component 102 can comprise non-volatile memory (e.g., flash memory) and/or volatile memory (e.g., static random access memory (SRAM)), where the memory array(s) 104 can be non-volatile memory. It is to be appreciated and understood that, while one memory component 102 is depicted in system 100, the subject innovation is not so limited, as system 100 can include a plurality of memory components 102. Only one memory component 102 is depicted herein for brevity and clarity.

Figure 6:
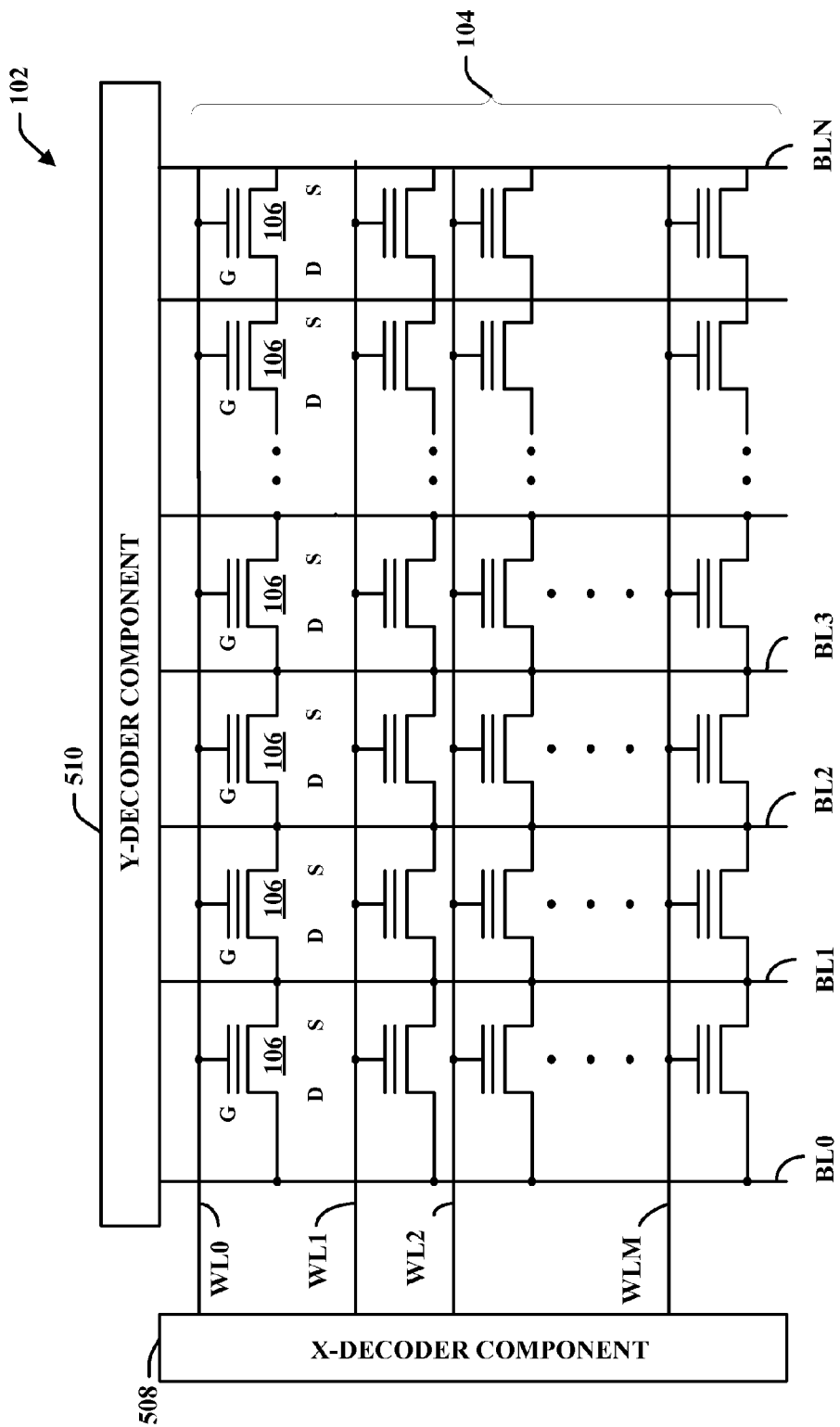
FIG. 6 illustrates a diagram of an example portion of a memory component in accordance with an aspect of the disclosed subject matter.

In an aspect, in the memory array 104, the memory cells 106 can be respectively associated with WLs (e.g., as illustrated in FIG. 6) and BLs (e.g., as illustrated in FIG. 6) that can be selected and respective voltages can be applied thereto, as desired, to facilitate performing program, read, verify, and/or erase operations on desired memory cells 106. Each memory cell 106 can comprise a gate (e.g., as illustrated in FIG. 6), drain (e.g., as illustrated in FIG. 6), and source (e.g., as illustrated in FIG. 6), where the gate can be connected to a WL and the drain and source of the memory cell 106 can be connected to respective and adjacent BLs. A predefined gate voltage can be applied to a gate, a predefined drain voltage can be applied to a drain, and a predefined source voltage can be applied to a source, of a memory cell 106 to facilitate performing a desired operation on the memory cell 106, where the respective voltages can be determined based at least in part on the type of operation being performed on the memory cell 106.

Figure 2:
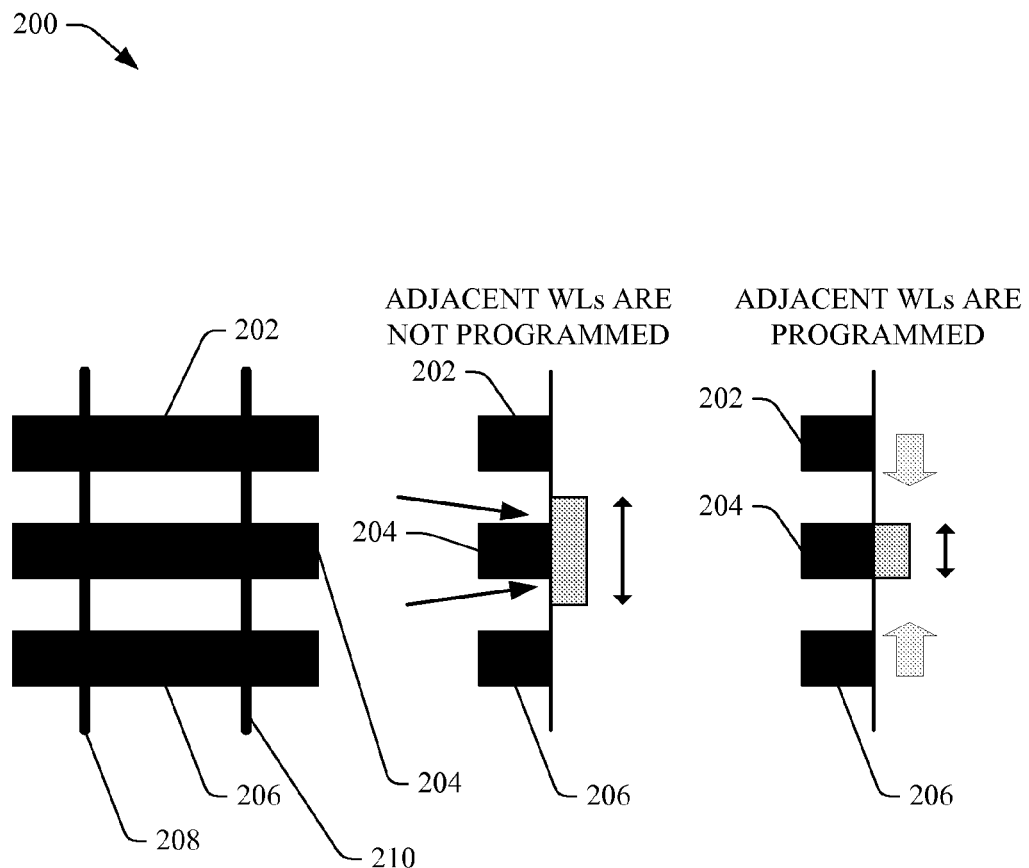
FIG. 2 illustrates a diagram of an example portion of a memory array.

Referring to FIG. 2, illustrated is a diagram of an example portion of a memory array 200. Conventionally, as memory arrays, such as memory array 200, have become more dense, WLs, such as WL 202, WL 204, and WL 206, and BLs, such as BL 208 and BL 210, are spaced closer together, and the width of WLs has become smaller. As a result, adjacent WL disturb has become more problematic in conventional memory devices. One adjacent WL disturb issue relates to instances when a read or verify operation is being performed on a selected memory cell associated with the WL 204 (e.g., selected WL) where a predefined gate voltage is applied to the selected WL 204 to facilitate performing the read or verify operation, and the memory cells associated with the adjacent WLs 202 and 206 have not been programmed where the WLs 202 and 206 can be set to ground. In such instances, an undesirable fringing current can be produced where the fringing current can flow under WL 204 as well as outside of WL 204, due in part to the small spacing between adjacent WLs and the small width of each WL. The fringing current can negatively impact the read or verify operation, as the fringing current can cause a shift in the Vt(s) related to a particular program state(s), and correspondingly shift in the drain-source current(s) ($I_{ds}$), which can cause the operation window of a memory cell to narrow.

Another adjacent WL disturb issue relates to instances when a read or verify operation is being performed on a selected memory cell associated with the selected WL 204 where a predefined gate voltage is applied to the selected WL 204 to facilitate performing the read or verify operation, and the memory cells associated with the adjacent WLs 202 and 206 have been programmed. With the memory cells associated with the adjacent WLs 202 and 206 being programmed, an undesirable fringing electric field can be generated by the adjacent WLs 202, 206 and/or the memory cells associated therewith, and the undesirable fringing electric field can extend to the selected WL 204 and/or the selected memory cell associated therewith. The fringing electric field can negatively impact the read or verify operation on the selected memory cell, as the fringing electric field can cause a shift in the Vt, and correspondingly shift in the $I_{ds}$, of the selected memory cell (e.g., the fringing electric field from the adjacent WLs 202, 206 can push the $I_{ds}$ associated with the selected memory cell), which can cause the operation window of the selected memory cell to narrow.

Referring again to FIG. 1, in accordance with an aspect of the disclosed subject matter, the memory component 102 can include an optimized operation component 108 can that can be associated with the memory array 104 and can facilitate applying a predefined negative gate voltage to WLs adjacent to (e.g., on each side of) a WL associated with a memory cell 106 selected for a read or verify operation to facilitate minimizing or reducing adjacent WL disturb in the selected memory cell 106 to reduce and/or minimize a shift in the Vt (and $I_{ds}$) of the selected memory cell 106 and improve or maintain the operation window of the selected memory cell 106.

Figure 3:
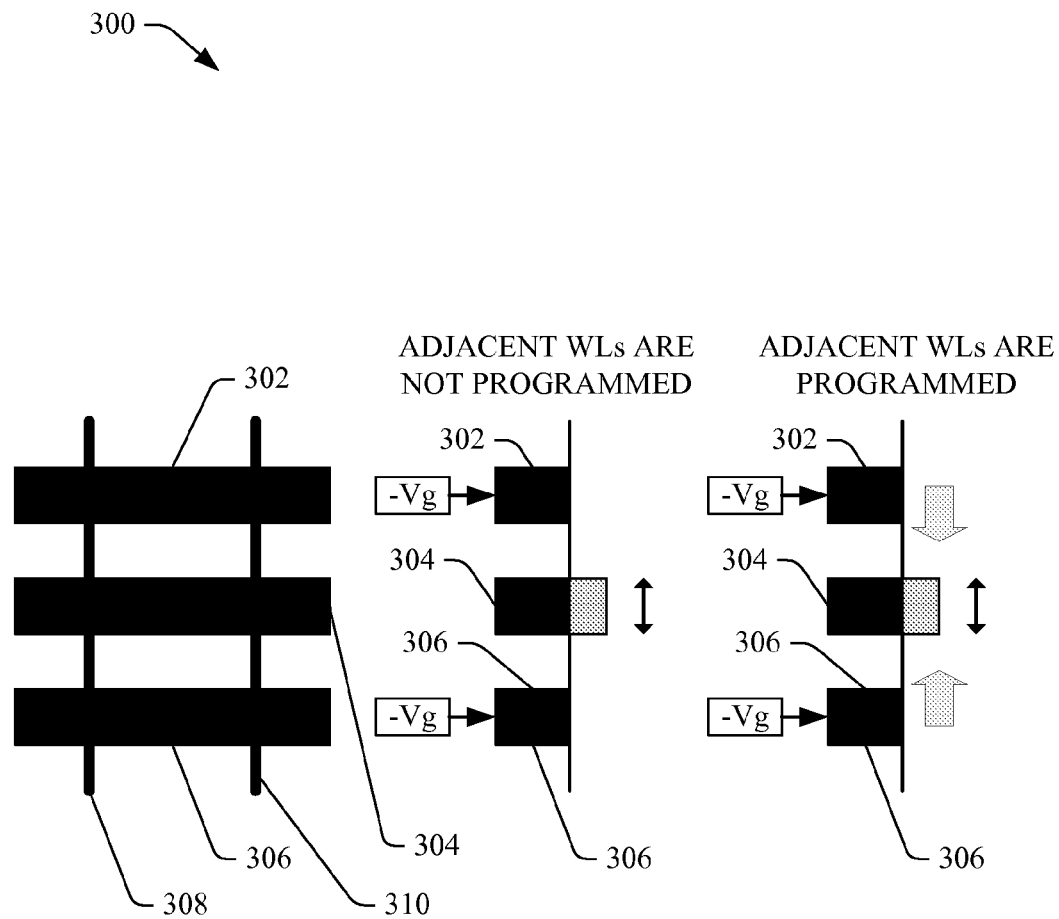
FIG. 3 depicts a diagram of an example portion of a memory array in accordance with various aspects of the disclosed subject matter.

Referring briefly to FIG. 3, illustrated is a diagram of an example portion of a memory array 104 in accordance with various aspects of the disclosed subject matter. The portion of the memory array 104 can the same or similar as, and/or can comprise the same or similar functionality as, a respective portion of the memory array 104, for example, as more fully described herein with regard to system 100. In one aspect, the memory array 104 can include WL 302, WL 304, and WL 306, which can be respectively associated with memory cells (e.g. 106) (e.g., the WLs can be respectively associated with the gates of the memory cells). The portion of the memory array 104 also can comprise BL 308 and BL 310, which can be associated with the memory cells (e.g., a BL can be associated with respective sources of the memory cells and the other BL can be associated with respective drains of the memory cells).

In another aspect, when the memory cells (not expressly shown in FIG. 3) associated with WLs 302 and 306 are not programmed (e.g., memory cells are in an erase state), during a read or verify operation of a selected memory cell 106 associated with WL 304, the optimized operation component 108 can facilitate applying a predefined negative gate voltage to the WLs 302 and 306 adjacent to WL 304 to facilitate reducing adjacent WL disturb on the selected memory cell 106. The negative gate voltages applied to the adjacent WLs 302 and 306 can facilitate reducing or minimizing a fringing current associated with the WL 304, which can reduce or minimize a shift in the Vt, and a corresponding shift in the $I_{ds}$, of the selected memory cell 106 and can improve or maintain a desired operation window for the selected memory cell 106.

In still another aspect, when the memory cells associated with WLs 302 and 306 are programmed to a specified data state, during a read or verify operation of a selected memory cell 106 associated with WL 304, the optimized operation component 108 can facilitate applying a predefined negative gate voltage to the WLs 302 and 306 adjacent to WL 304 to facilitate reducing adjacent WL disturb on the selected memory cell 106. The negative gate voltages applied to the adjacent WLs 302 and 306 can facilitate reducing or minimizing a fringing electric field generated by the adjacent WLs 302 and 306 and memory cells associated therewith such that the fringing electric field is not strong enough to extend to, or at least has less or minimal impact on, the selected WL 304 and selected memory cell 106 associated therewith, which can reduce or minimize a shift in the Vt, and a corresponding shift in the $I_{ds}$, of the selected memory cell 106 and can improve or maintain a desired operation window for the selected memory cell 106.

In yet another aspect, the voltage level(s) of the predefined negative gate voltage applied to adjacent WLs 302 and 306 during a read or verify operation on a selected memory cell 106 associated with a selected WL 304 can be based at least in part on predefined operation criteria, which can include, for example, type of memory cell 106, number of memory elements in the memory cell 106, number of available data levels for each memory element in the memory cell 106, type of operation being performed on a selected memory cell 106, spacing between WLs, width of WLs, whether adjacent WLs (e.g., 302, 306) are associated with programmed memory cells, whether the adjacent WLs are associated with unprogrammed memory cells, etc. Each adjacent WL 302 and 306 can have a respective predefined gate voltage, which can be the same as or different from another adjacent WL. In still another aspect, the predefined negative gate voltage can be dynamically modified during the lifetime of the memory component 102 based at least in part on the predefined operation criteria, as desired, to facilitate reducing adjacent WL disturb.

Referring again to FIG. 1 and the memory component 102, in accordance with one embodiment, the optimized operation component 108 can measure and evaluate the amount of adjacent WL disturb associated with a selected WL and selected memory cell and/or amount of shift in Vt and $I_{ds}$ associated with a selected memory cell 106 to facilitate determining whether to modify a negative gate voltage to be applied to WLs adjacent to a selected WL and selected memory 106 during a read or verify operation, based at least in part on predefined operation criteria. In an aspect, the optimized operation component 108 can perform evaluations during each read or verify operation or can perform evaluations periodically (e.g., every 10 operations, every 100 operations, every 1000 operations, . . . ), as desired. If the optimized operation component 108 determines that the amount of adjacent WL disturb and/or amount of shift in Vt or $I_{ds}$ of a selected memory cell 106 meets or exceeds a predetermined threshold level, the optimized operation component 108 can facilitate determining a desired negative gate voltage that can be applied to WLs (e.g. 302, 306) adjacent to a selected WL (e.g., 304) during a read or verify operation on a selected memory cell 106 associated with the selected WL (e.g., surrounded by the adjacent WLs), based at least in part on predefined operation criteria. The optimized operation component 108 can facilitate applying the modified negative gate voltage to adjacent WLs (e.g., 302, 306) during read or verify operations associated with a selected memory cell 106.

Referring again to the memory component 102, the nonvolatile memory can include, but is not limited to, flash memory (e.g., single-bit flash memory, multi-bit flash memory), read-only memory (ROM), mask-programmed ROM, programmable ROM (PROM), Erasable PROM (EPROM), Ultra Violet (UV)-erase EPROM, one-time programmable ROM, electrically erasable PROM (EEPROM), and/or nonvolatile RAM (e.g., ferroelectric RAM (FeRAM)). A flash memory can comprise NAND memory and/or NOR memory, for example. Volatile memory can include, but is not limited to, random access memory (RAM), SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Figure 4:
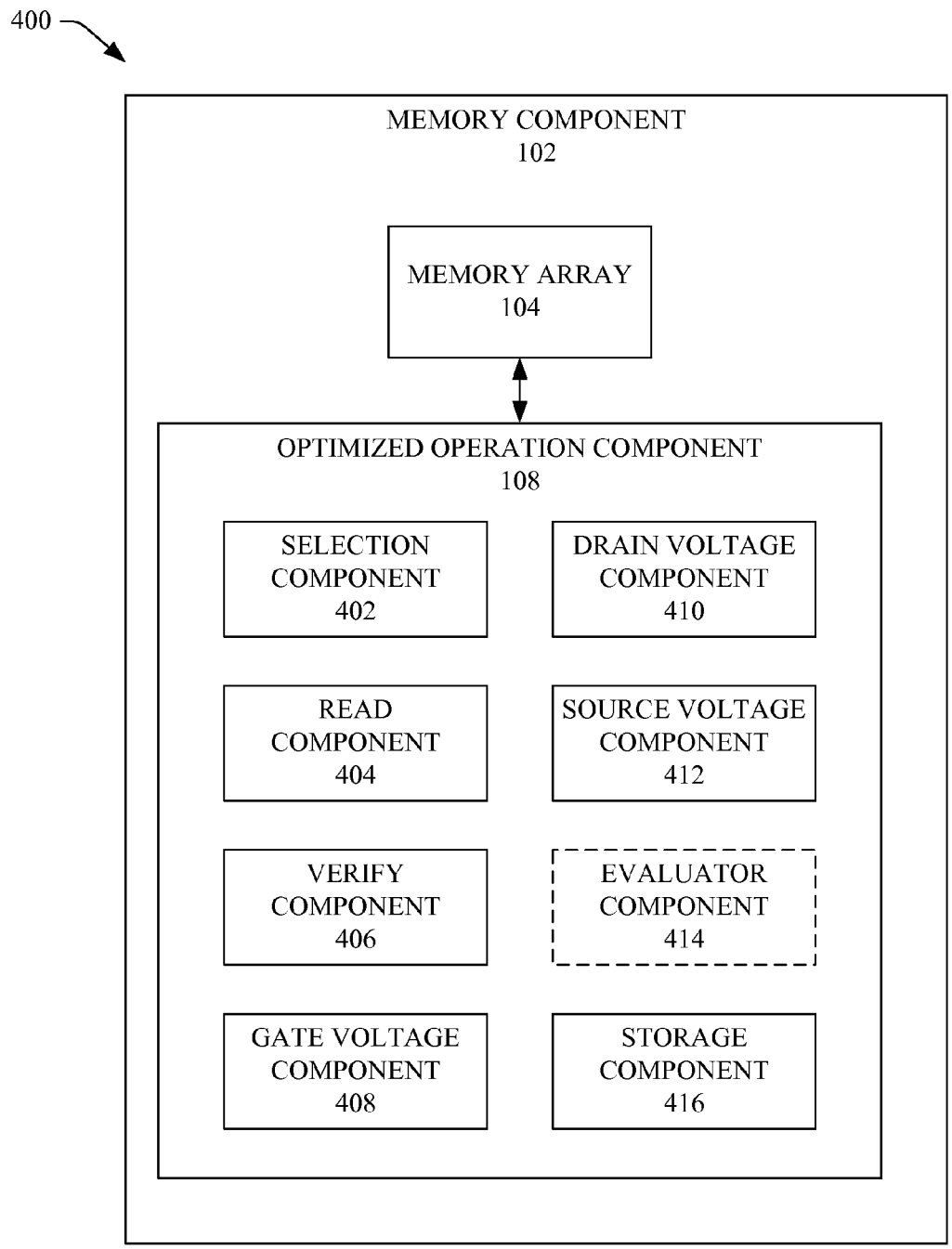
FIG. 4 illustrates a block diagram of a system that can apply a desired negative gate voltage to wordlines adjacent to a selected wordline associated with a selected memory cell in a memory component to reduce adjacent wordline disturb in accordance with an aspect of the disclosed subject matter.

FIG. 4 illustrates a block diagram of a system 400 that can apply a desired negative gate voltage to wordlines adjacent to a selected wordline associated with a selected memory cell in a memory component to reduce adjacent wordline disturb in accordance with an aspect of the disclosed subject matter. System 400 can comprise a memory component 102 that can be utilized to store data. The memory component 102 can include a memory array 104 that can contain a plurality of memory cells 106 (not shown in FIG. 4; e.g., as illustrated in FIG. 1 and described herein), where each memory cell 106 can store one or more bits of data. The memory component 102 can further contain an optimized operation component 108 that can apply a predefined negative gate voltage to WLs adjacent to a selected WL connected with a selected memory cell 106 in the memory component 102 to facilitate reducing or minimizing adjacent WL disturb in the memory cell 106. It is to be appreciated and understood that the memory component 102, memory array 104, memory cells 106, and optimized operation component 108, each can be the same or similar as, and/or can comprise the same or similar respective functionality as, respective components, such as more fully described herein, for example, with regard to system 100.

In accordance with an aspect, the optimized operation component 108 can include a selection component 402 that can facilitate selecting a memory cell(s) 106 that is to be read or verified based at least in part on a read or verify command received by the memory component 102. In another aspect, the selection component 402 also can facilitate selecting WLs (e.g., 302, 306) adjacent to a WL (e.g., 304) associated with a selected memory cell 106 to facilitate applying a desired negative gate voltage to the adjacent WLs during the read or verify operation.

In accordance with an aspect, the optimized operation component 108 can include a read component 404 that can facilitate performing a read operation on a selected memory cell(s) 106 to read data stored in a selected memory cell(s) 106 based at least in part on a received read command. The optimized operation component 108 also can comprise a verify component 406 that can facilitate performing a verify operation on a selected memory cell(s) 106 to verify data stored in a selected memory cell(s) 106 based at least in part on a received verify command.

In yet another aspect, the optimized operation component 108 can employ a gate voltage component 408 that can facilitate setting, adjusting, and/or applying respective gate voltages to memory cells 106 in the memory component 102 based at least in part on an operation (e.g., read, verify, program, erase) that is to be performed on a desired memory cell(s) 106. For instance, during an operation, such as a read or verify operation, the gate voltage component 408 can facilitate setting and/or applying a predefined gate voltage to a WL (e.g., 304) connected to a selected memory cell 106 on which the desired operation is to be performed. Also, during the operation, the gate voltage component 408 can facilitate setting and/or applying a predefined negative gate voltage to WLs (e.g., 302, 306) adjacent to the selected WL (e.g., 304) to facilitate reducing adjacent WL disturb in the selected WL and selected memory cell 106 associated therewith.

In still another aspect, the optimized operation component 108 also can contain a drain voltage component 410 that can facilitate setting, adjusting, and/or applying a predefined drain voltage to desired memory cells 106 to facilitate performing a desired operation on the desired memory cells 106. The optimized operation component 108 can further contain a source voltage component 412 that can facilitate setting, adjusting, and/or applying a predefined source voltage to desired memory cells 106 to facilitate performing a desired operation on the desired memory cells 106.

In accordance with one embodiment, the optimized operation component 108 optionally can contain an evaluator component 414 that can monitor, measure, and evaluate the amount of adjacent WL disturb associated with a selected WL and selected memory cell and/or amount of shift in the Vt and/or $I_{ds}$ associated with a selected memory cell 106 to facilitate determining whether to modify a negative gate voltage applied to WLs adjacent to a selected WL and selected memory 106 during a read or verify operation, based at least in part on predefined operation criteria. The evaluator component 414 can perform evaluations during each read or verify operation or can perform evaluations periodically (e.g. every 10 operations, every 100 operations, every 1000 operations, . . . ), as desired. If the evaluator component 414 determines that the amount of adjacent WL disturb and/or amount of shift in Vt or $I_{ds}$ of a selected memory cell 106 meets or exceeds a predetermined threshold level, the evaluator component 414 can facilitate determining a desired negative gate voltage that can be applied to adjacent WLs during a read or verify operation on a selected memory cell 106 associated with a selected WL (e.g., surrounded by the adjacent WLs), based at least in part on predefined operation criteria. The evaluator component 414 can operate in conjunction with the gate voltage component 408 to facilitate modifying and/or applying the negative gate voltage applied to adjacent WLs when it is determined that the negative gate voltage is to be modified.

The optimized operation component 108 also can include a storage component 416 that can store data, code, commands, etc., related to performing operations on memory cells 106. For instance, the storage component 416 can store information related to setting, adjusting, and/or applying a predefined negative gate voltage to WLs adjacent to a selected WL and associated selected memory cell 106 during a read or verify operation on the selected memory cell 106. The storage component 416 can comprise volatile memory, such as, for example, RAM, SRAM, DRAM, SDRAM, DDR SDRAM, ESDRAM, SLDRAM, RDRAM, DRDRAM, and/or RDRAM. It is to be appreciated and understood that the selection component 402, read component 404, verify component 406, gate voltage component 408, drain voltage component 410, source voltage component 412, and optional evaluator component 414, and storage component 416, each can be a stand-alone unit, can be included within the optimized operation component 108 (as depicted), can be incorporated within another component, and/or virtually any suitable combination thereof, as desired.

Figure 5:
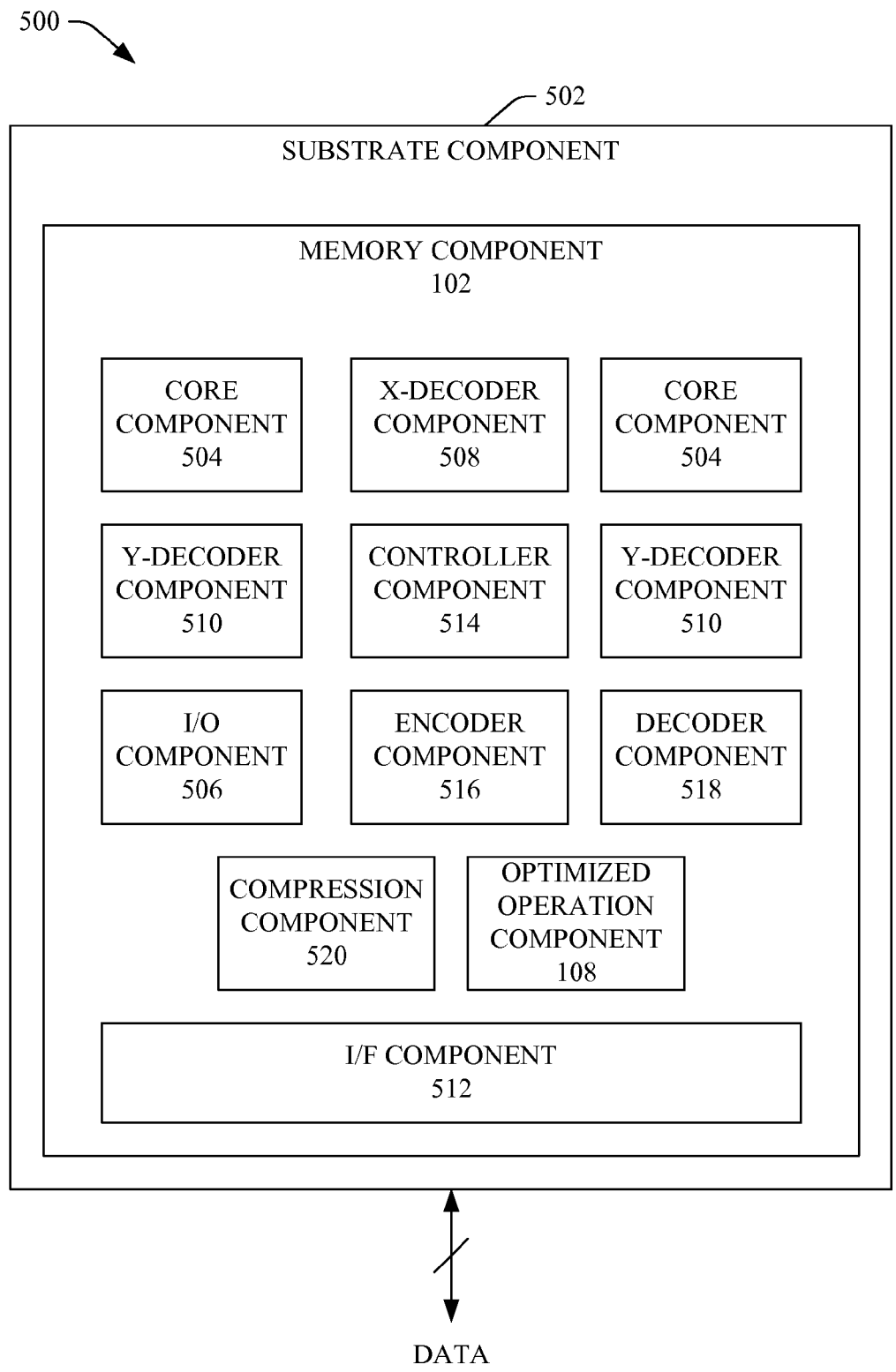
FIG. 5 depicts a block diagram of a memory device that can optimize performance of operations to facilitate reducing adjacent wordline disturb associated with a memory cell(s) in a memory device in accordance with an aspect of the disclosed subject matter.

Turning to FIG. 5, depicted is a block diagram of a memory device 500 that can optimize performance of operations to facilitate reducing adjacent wordline disturb associated with a memory cell(s) in a memory device in accordance with an aspect of the disclosed subject matter. Memory device 500 can comprise a memory component 102 that can comprise a non-volatile memory (e.g., flash memory) and/or volatile memory (e.g., SRAM). The memory component 102 can receive information, including data, commands, and/or other information, which the memory component 102 can process (e.g., store data, execute commands, etc.). The memory component 102 can include a memory array(s) 104 (not shown in FIG. 5; e.g. as illustrated in FIG. 1 and described herein) that can comprise a plurality of memory cells (e.g., 106) (not shown in FIG. 5; e.g., as illustrated in FIG. 1 and described herein) in which data can be stored. The memory component 102 can also comprise an optimized operation component 108 that can facilitate applying a predefined negative gate voltage to WLs adjacent to a selected WL associated with a selected memory cell 106 during a read or verify operation associated with the selected memory cell 106 in the memory array 104 to facilitate reducing or minimizing adjacent WL disturb. It is to be appreciated and understood that the memory component 102, memory array 104, memory cells 106, and optimized operation component 108, each can be the same or similar as, and/or can comprise the same or similar respective functionality as, respective components, such as more fully described herein, for example, with regard to system 100 and system 400.

In one aspect, the memory component 102, including the memory array 104 and optimized operation component 108, and other components described herein, for example, with regard to memory device 500 can be formed and/or contained on a substrate component 502 (e.g., semiconductor substrate). In another aspect, one or more core components 504 (e.g., high-density core regions) and one or more lower-density peripheral regions can be formed on the substrate 502. The core component(s) 504 typically can include one or more M by N arrays (e.g., memory array 104) of individually addressable, substantially identical multi-bit memory cells (e.g., 106).

The lower-density peripheral regions can typically include an input/output component 506 (e.g., input/output (I/O) circuitry) and programming circuitry for selectively addressing the individual memory cells. The programming circuitry can be represented in part by and can include one or more x-decoder components 508 and one or more y-decoder components 510 that can cooperate with the I/O component 506 for selectively connecting a source (not shown), gate (not shown), and/or drain (not shown) of selected addressed memory cells to predetermined voltages or impedances to effect designated operations (e.g. programming, reading, verifying, erasing) on the respective memory cells, and deriving necessary voltages to effect such operations. For example, an x-decoder component 508 and a y-decoder component 510 can each receive address bus information, which can be provided as part of a command, and such information can be utilized to facilitate determining the desired memory cell(s) in the memory component 102.

Figure 7:
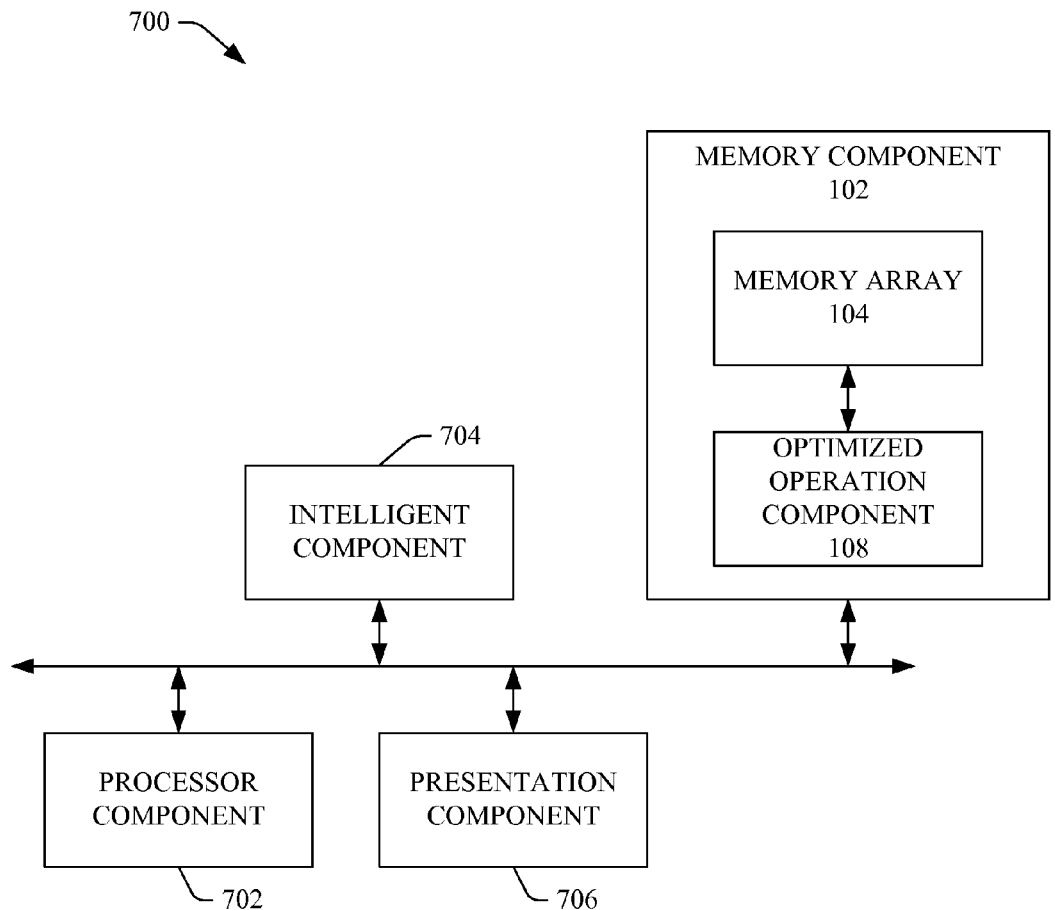
FIG. 7 depicts a block diagram of a system that can employ intelligence to facilitate optimization of operations in a memory component to facilitate reducing adjacent wordline disturb in accordance with an embodiment of the disclosed subject matter.

The memory component 102 can receive information (e.g., data, commands, etc.) via an interface component 512 (also referred to herein as "I/F 512"), which can also be formed on substrate 502. I/F 512 can include and/or provide various adapters, connectors, channels, communication paths, etc. to integrate the memory component 102 into virtually any operating and/or database system(s) and/or with another system(s). In addition, I/F 512 can provide various adapters, connectors, channels, communication paths, etc., that can provide for interaction and/or communication with a processor component (e.g., as depicted in FIG. 7 and described herein), and/or any other component, data, and the like, associated with the memory device 500.

In another aspect, the memory device can include a controller component 514 that can be formed on substrate 502. The controller component 514 can facilitate control of the flow of data to and from the memory component 102. In an aspect, the controller component 514 can facilitate execution of operations (e.g., read, write, verify, erase) associated with memory cells 106 in the memory array 104 based at least in part on received commands.

The memory component 102 can also contain an encoder component 516 that can facilitate encoding data being programmed to the memory component 102, where the encoder component 516 also can be formed on the substrate 502. For example, the encoder component 516 can facilitate converting a digital signal to an analog signal (e.g., current level) to facilitate programming data in the storage locations (e.g., memory cells) in the memory component 102.

The memory component 102 can further include a decoder component 518 that can facilitate decoding data being read from the memory component 102. The decoder component 518 can receive an analog signal associated with data, where the analog signal can be stored in the storage location in the memory array 104, and can facilitate converting the analog signal to a digital signal, so that such digital signal representing the read data can be provided to another component (e.g., processor component) for further processing.

Memory component 102 can further include a compression component 520 that can be formed on substrate 502 and can be used to facilitate the compression and decompression of data and/or code to be stored in the memory array 104, to facilitate reducing and/or minimizing the consumption of the available memory in the memory array 104. For example, in response to a request by a host processor (e.g., processor component 702, as illustrated in FIG. 7 and described herein) to read data (e.g., MP3 file) from the memory component 102, the requested data can be retrieved from the memory array 104, with the compression component 520 being used to facilitate de-compression of the data being read from the memory array 104. The de-compressed data can be provided by the memory component 102 to the host processor. In another aspect, the compression component 520 can be used to compress data being received from a host processor for storage in the memory array 104, with the compression component 520 compressing the data before storing the data in a specified location in the memory array 104. Common forms of data compression include algorithms based upon the Lempel-Ziv (LZ) compression method including LZ-Welch, LZ-Renau, and Huffman. Data compression techniques can be "lossy" or "lossless", where "lossy" compression can involve the loss of information between the source code and the compressed code and can be an acceptable effect in such applications as image and sound files, and "lossless" compression schemes can be reversible, allowing the original data to be fully reconstructed. Choice between the use of "lossy" vs. "lossless" compression can depend in part upon the application and file type to be compressed.

In one aspect, memory device 500 can also include a bus (not shown) that can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

FIG. 6 illustrates a diagram of an example portion of a memory component 102 in accordance with an aspect of the disclosed subject matter. The portion of the memory component 102 can comprise a memory array 104 that can include a plurality of memory cells 106 that each can be comprised of a drain (D), gate (G), and source (S). It is to be understood that, as desired, the drain also can act as a source, and the source can act as a drain, depending in part on the operation being performed on the memory cell 106. Each memory cell 106 can have one or more data levels (e.g. 4 data levels) therein and can thereby store one or more bits of data therein. In another aspect, each memory cell 106 can comprise multiple memory elements that each can be programmed to a respective data level. For example, in accordance with an embodiment, a memory cell 106 can comprise two memory elements that each can be set to one of four available data levels, thereby allowing the memory cell 106 to have sixteen available data states corresponding to four bits of data storage available.

In an aspect, the memory array 104 can be associated with an X-decoder component 508 (e.g., WL decoder) and a Y-decoder component 510 (e.g., BL decoder) that can each respectively decode inputs/outputs during various operations (e.g., programming, reading, verifying, erasing) that can be performed on the memory cells 106. The X-decoder component 508 and Y-decoder component 510 can each receive address bus information from a host processor (e.g., as illustrated in FIG. 7) and/or system controller (not shown) or the like, and can utilize such information to facilitate accessing or selecting the desired memory cell(s) (e.g., memory location(s)) associated with the command. The memory cells 106 can be formed in M rows and N columns. A common WL can be attached to the gate of each memory cell 106 in a row, such as word-lines WL0, WL1, WL2, through WLM. A common BL can be attached to each cell 106 in a column, such as bit-lines BL0, BL1, through BLN. A WL can contain, for example, 1024 elements forming multiple words and a sector can include, for example, 512 WLs to provide at least 512 k elements of memory. In accordance with an aspect of the disclosed subject matter, respective voltages can be applied to one or more cells 106 through the WLs and BLs to facilitate performing operations, such as program, read, erase, and the like.

Referring to FIG. 7, depicted is a block diagram of a system 700 that can employ intelligence to facilitate optimization of operations in a memory component to facilitate reducing adjacent wordline disturb in accordance with an embodiment of the disclosed subject matter. System 700 can include a memory component 102 that can be comprised of a nonvolatile memory (e.g., multi-bit flash memory) and/or volatile memory (e.g., SRAM). The memory component 102 can include a memory array 104 that can be comprised of a plurality of memory cells 106 (not shown), where, for each memory cell 106, one or more bits of data can be stored (e.g., a memory cell can comprise one or more memory elements, wherein each memory element can store one or more bits of data), and from which stored data can be read. The memory component 102 also can include an optimized operation component 108 that can apply a predefined negative gate voltage to WLs adjacent to a selected WL associated with a selected memory cell 106 during a read or verify operation associated with the selected memory cell 106 to facilitate reducing adjacent WL disturb in the selected memory cell 106. It is to be appreciated that the memory component 102, memory array 104, memory cells 106, and optimized operation component 108, each can be the same or similar as respective components, and/or can contain the same or similar functionality as respective components, as more fully described herein, for example, with regard to system 100, system 400, memory device 500, and the portion of a memory component 600.

The system 700 can further include a processor component 702 that can be associated with the memory component 102 and other components via a bus. In accordance with an embodiment of the disclosed subject matter, the processor component 702 can be a typical applications processor that can manage communications and run applications. For example, the processor component 702 can be a processor that can be utilized by a computer, mobile handset, personal data assistant (PDA), or other electronic device. The processor component 702 can generate commands, including read, write, and/or erase commands, in order to facilitate reading data from, writing data to, and/or erasing data from the memory component 102.

The system 700 also can include an intelligent component 704 that can be associated with the memory component 102 and/or other components associated with system 700 to facilitate analyzing data, such as current and/or historical information related to operations (e.g., read, verify) performed in the memory component 102, and, based in part on such information, can make an inference(s) and/or a determination(s) regarding, for example, whether an amount of adjacent WL disturb meets or exceeds a predetermined threshold amount of adjacent WL disturb with regard to a memory cell (e.g., selected memory cell 106); whether an amount of shift in a Vt or $I_{ds}$ associated with a memory cell (e.g., selected memory cell 106) meets or exceeds a predetermined threshold amount of shift; whether a negative gate voltage level, which is to be applied to adjacent WLs (e.g. 302, 306) during a read or verify operation, is to be adjusted to facilitate reducing adjacent WL disturb in a selected memory cell 106; whether evaluations of memory cells 106 with regard to adjacent WL disturb, Vt shift, or $I_{ds}$ shift are to be increased in frequency; etc., based at least in part on predefined operation criteria.

For instance, based in part on current and/or historical evidence related to operations, such as read or verify operations, the intelligent component 704 can infer that due to wear observed over the life of the memory component 102 or based at least in part on other criteria, a negative gate voltage, which is applied to adjacent WLs during a read or verify operation on a selected memory cell 106 associated with a selected WL (e.g., surrounded by the adjacent WLs), is to be modified to facilitate reducing adjacent WL disturb in the selected memory cell 106. Based at least in part on the inference with respect to such data by the intelligent component 704, the optimized operation component 108 can facilitate modifying the negative gate voltage applied to the adjacent WLs.

As another example, the intelligent component 704 can evaluate current and/or historical related to the memory cells 106 and can determine and/or infer that the amount of adjacent WL disturb, Vt shift, and/or $I_{ds}$ shift, is beginning to trending higher at an increased rate, while still below the respective predetermined threshold levels (e.g. predetermined amount of adjacent WL disturb, predetermined threshold amount of shift). Based at least in part on such determination or inference, the intelligent component 704 can infer or determine that the frequency of evaluating the adjacent WL disturb, Vt shift, or $I_{ds}$ shift, associated with the memory cells 106 is to be increased, so that the memory cells 106 are evaluated more often to determine whether any of the respective threshold levels are met or exceeded to facilitate modifying the negative gate voltage applied to adjacent WLs during read or verify operations.

It is to be understood that the intelligent component 704 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 700 also can include a presentation component 706, which can be connected with the processor component 702. The presentation component 706 that provides various types of user interfaces to facilitate interaction between a user and any component coupled to the processor component 702. As depicted, the presentation component 706 is a separate entity that can be utilized with the processor component 702 and associated components. However, it is to be appreciated that the presentation component 706 and/or similar view components can be incorporated into the processor component 702 and/or a stand-alone unit. The presentation component 706 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the processor component 702.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and enhanced graphics adapter (EGA)) with limited graphic support, and/or low bandwidth communication channels.

In accordance with one embodiment of the disclosed subject matter, the memory component 102, including the memory array 104, memory cells 106, the optimized operation component 108, and/or other components, can be situated or implemented on a single integrated-circuit chip. In accordance with another embodiment, the memory component 102, including the memory array 104, the memory cells 106, the optimized operation component 108, and/or other components, can be implemented on an application-specific integrated-circuit (ASIC) chip. In yet another embodiment, the memory component 102 including the memory array 104, the memory cells 106, the optimized operation component 108, and/or other components, can be situated or implemented on multiple dies or chips.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 8:
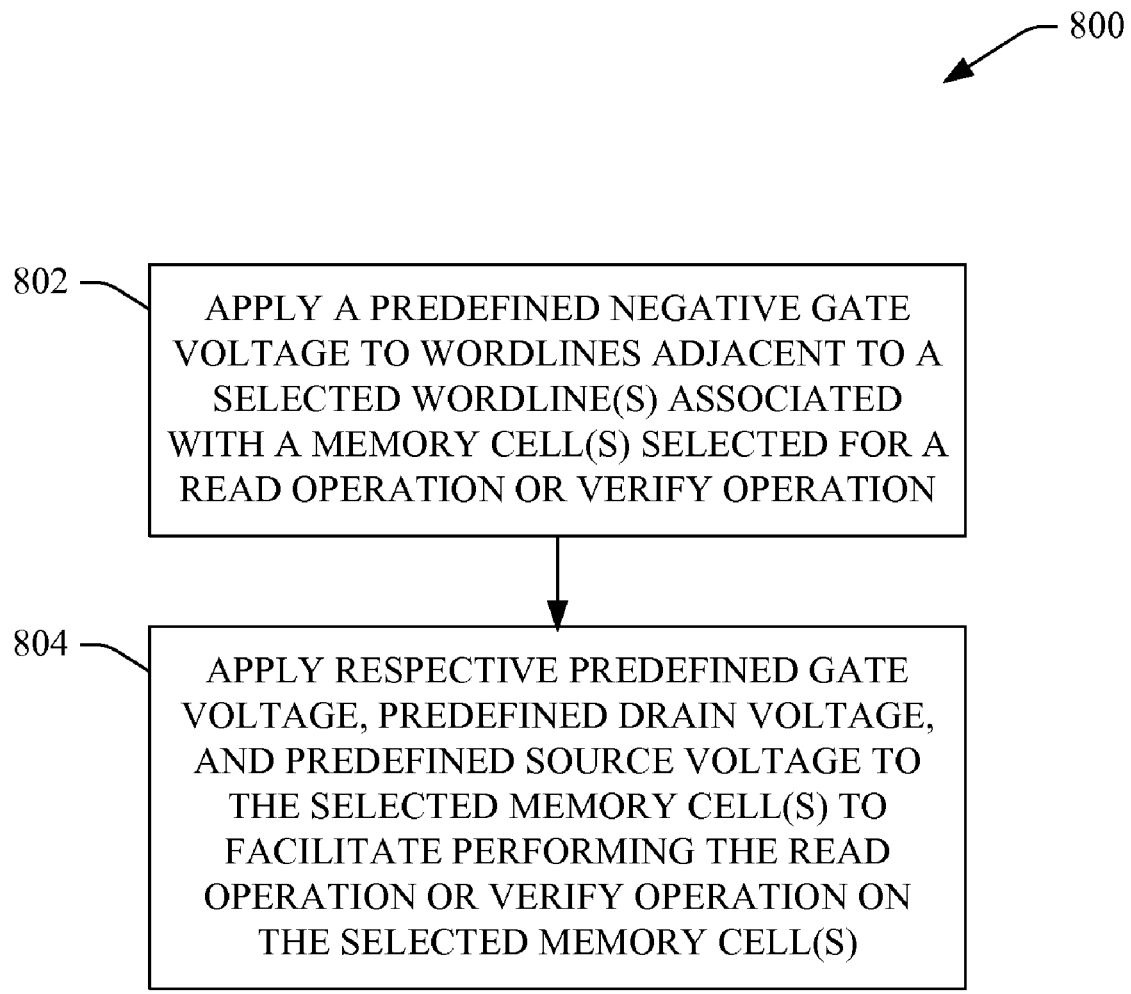
FIG. 8 illustrates a methodology that can facilitate optimizing operations associated with a memory to facilitate reducing adjacent wordline disturb in the memory in accordance with an aspect of the disclosed subject matter.
Figure 9:
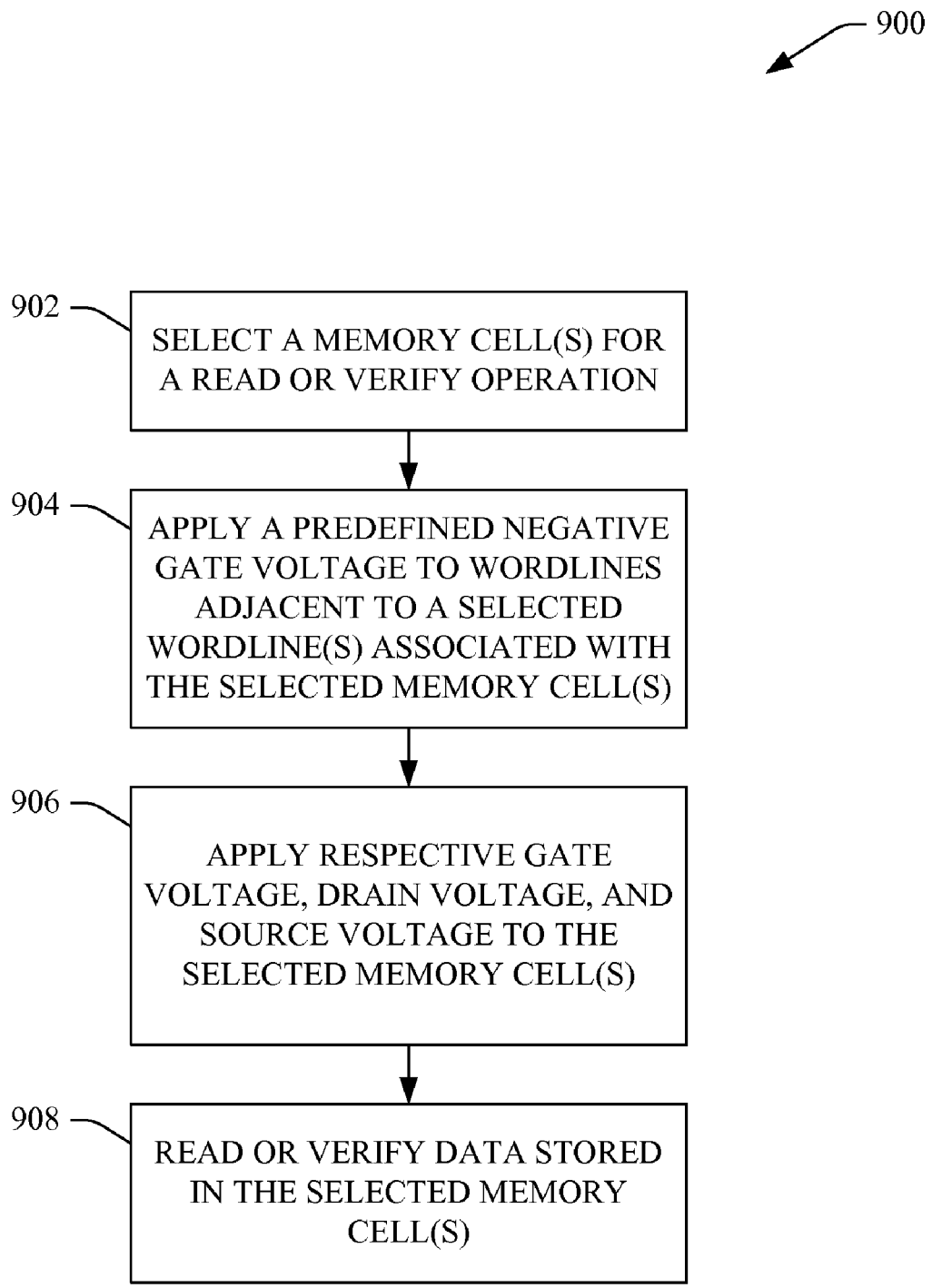
FIG. 9 depicts another methodology that can facilitate optimizing operations performed in a memory to facilitate reducing adjacent wordline disturb in the memory in accordance with an aspect of the disclosed subject matter.
Figure 10:
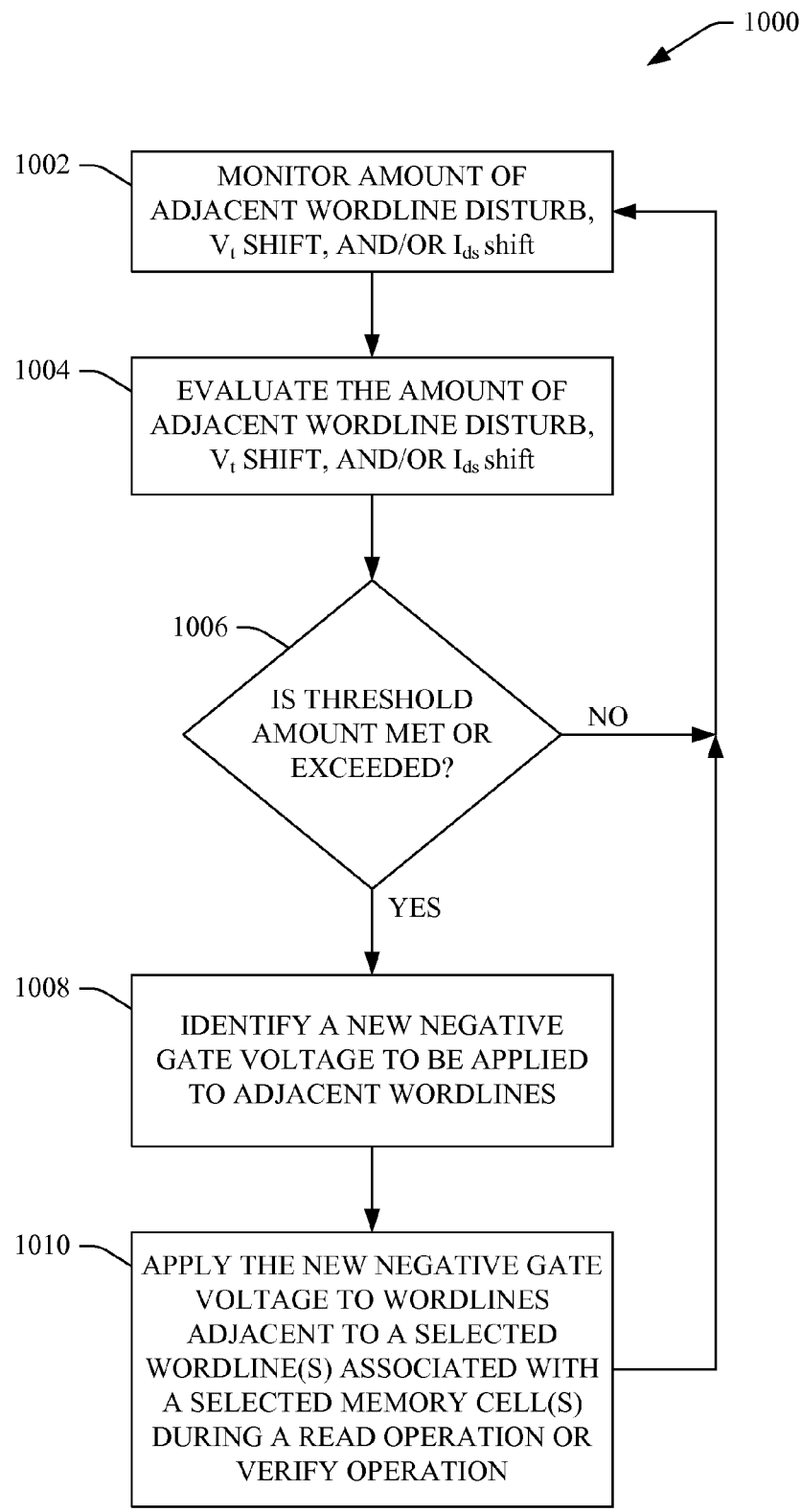
FIG. 10 illustrates a methodology that can facilitate modifying negative drain voltage levels applied to wordlines adjacent to a selected wordline associated with a selected memory cell during a read or verify operation associated with a memory in accordance with an aspect of the disclosed subject matter.

FIGS. 8-10 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 8, illustrated is a methodology 800 that can facilitate optimizing operations associated with a memory to facilitate reducing adjacent wordline disturb in the memory in accordance with an aspect of the disclosed subject matter. At 802, during execution of a received read command or verify command on a selected memory cell(s) 106 in a memory component 102, a predefined negative gate voltage can be applied to WLs adjacent to a selected WL(s) associated with a memory cell(s) 106 selected for a read or verify operation to facilitate reducing adjacent WL disturb, which can result in a reduction in Vt shift (and a corresponding reduction in shift in $I_{ds}$) associated with the selected memory cell(s) 106. In one aspect, an optimized operation component 108 in the memory component 102 can facilitate applying a predefined negative gate voltage to WLs (e.g., 302, 306) adjacent to a selected WL (e.g., 304) associated with a selected memory cell(s) 106 during performance of a read or verify operation.

At 804, a respective predefined gate voltage, predefined drain voltage, and predefined source voltage can be applied to the selected memory cell(s) 106 (e.g., the gate, drain, and source of a selected memory cell) to facilitate performing a read operation or verify operation to facilitate reading or verifying data stored in the selected memory cell(s) 106 based at least in part on a received read command or verify command. In an aspect, the data stored in a selected memory cell(s) 106 can be read or verified based at least in part on the Vt(s) of a selected memory cell(s) 106 (e.g., respective Vt associated with each data level of each selected memory cell 106) and the voltage level detected in the selected memory cell(s) 106. At this point, methodology 800 can end.

Turning to FIG. 9, illustrated is another methodology 900 that can facilitate optimizing operations performed in a memory to facilitate reducing adjacent wordline disturb in the memory in accordance with an aspect of the disclosed subject matter. At 902, a memory cell(s) 106 can be selected for a read operation or verify operation based at least in part on a received command (e.g., read command, verify command). In an aspect, one or more memory cells 106 in a memory component 102 can be selected to facilitate performing a read or verify operation on the selected memory cell(s) 106.

At 904, a predefined negative gate voltage can be applied to WLs (e.g. 302, 306) adjacent to a selected WL(s) (e.g. 304) associated with a selected memory cell(s) 106. In an aspect, the optimized operation component 108 can facilitate applying a predefined negative gate voltage to WLs adjacent to a selected WL(s) connected to a selected memory cell(s) 106 to facilitate reducing adjacent WL disturb in the selected memory cell(s) 106.

At 906, a respective predefined gate voltage(s), predefined drain voltage(s), and predefined source voltage(s) can be applied to the selected memory cell(s) 106 to facilitate performing the read operation or verify operation. In an aspect, the optimized operation component 108 can facilitate applying predefined gate voltage(s), predefined drain voltage(s), and predefined source voltage(s) to the selected memory cell (s) 106 to facilitate performing the read operation or verify operation on the selected memory cell(s) 106.

At 908, data stored in the selected memory cell(s) 106 can be read or verified based at least in part on the voltage level(s) (e.g., respective voltage level of each selected memory cell 106) detected in the selected memory cell(s) 106 and the Vt(s) (e.g., respective Vt associated with each data level of each selected memory cell 106) associated with the selected memory cell(s). At this point, methodology 900 can end.

Referring to FIG. 10, illustrated is a methodology 1000 that can facilitate modifying negative drain voltage levels applied to wordlines adjacent to a selected wordline associated with a selected memory cell during a read or verify operation associated with a memory in accordance with an aspect of the disclosed subject matter. At 1002, the amount of adjacent WL disturb, Vt shift, and/or $I_{ds}$ shift associated with a memory cell(s) 106 can be monitored. In an aspect, the optimized operation component 108 can monitor, measure the amount of adjacent WL disturb, Vt shift, and/or $I_{ds}$ shift associated with a memory cell(s) 106 (e.g., selected memory cell 106) in the memory component 102.

At 1004, the amount of adjacent WL disturb, Vt shift, and/or $I_{ds}$ shift associated with a memory cell(s) 106 (e.g., selected memory cell(s) 106) can be evaluated to facilitate determining whether the amount of adjacent WL disturb, Vt shift, and/or $I_{ds}$ shift meets or exceeds respective predetermined threshold amount (e.g., predetermined threshold amount of adjacent WL disturb, predetermined threshold amount of Vt shift, predetermined threshold amount of $I_{ds}$ shift). In an aspect, the optimized operation component 108 and/or intelligent component 704 can evaluate a memory cell(s) 106 to facilitate determining whether the memory cell(s) 106 is below a respective predetermined threshold amount (e.g., predetermined threshold amount of adjacent WL disturb, predetermined threshold amount of Vt shift, predetermined threshold amount of $I_{ds}$ shift).

At 1006, a determination can be made regarding whether the amount of adjacent WL disturb, Vt shift, or $I_{ds}$ shift for the memory cell(s) 106 is below the respective predetermined threshold amount (e.g., predetermined threshold amount of adjacent WL disturb, predetermined threshold amount of Vt shift, predetermined threshold amount of $I_{ds}$ shift).

If at 1006, it is determined that the adjacent WL disturb, Vt shift, or $I_{ds}$ shift for the memory cell(s) is below a respective predetermined threshold amount, the methodology 1000 can return to reference numeral 1002, where the methodology 1000 can proceed to monitor the amount of adjacent WL disturb, Vt shift, and/or $I_{ds}$ shift associated with a memory cell(s) 106.

If at 1006, it is determined that the adjacent WL disturb, Vt shift, or $I_{ds}$ shift for the memory cell(s) is not below a respective predetermined threshold amount, at 1008, a new negative gate voltage level to be applied to WLs adjacent to a selected WL can be identified such that, when applied to WLs adjacent to a selected WL associated with a selected memory cell(s) 106 on which a read or verify operation is to be performed, the amount of adjacent WL disturb, Vt shift, or $I_{ds}$ shift for the memory cell(s) 106 can be below the respective predetermined threshold amount.

At 1010, the identified new negative gate voltage level can be applied to WLs adjacent to a selected WL(s) (e.g. surrounded by the adjacent WLs associated with a selected memory cell(s) 106 during a read operation or verify operation. At this point, methodology 1000 can return to reference numeral 1002, where the amount of adjacent WL disturb, Vt shift, and/or $I_{ds}$ shift associated with a memory cell(s) 106 can be monitored. At this point, methodology 1000 can end.

Figure 11:
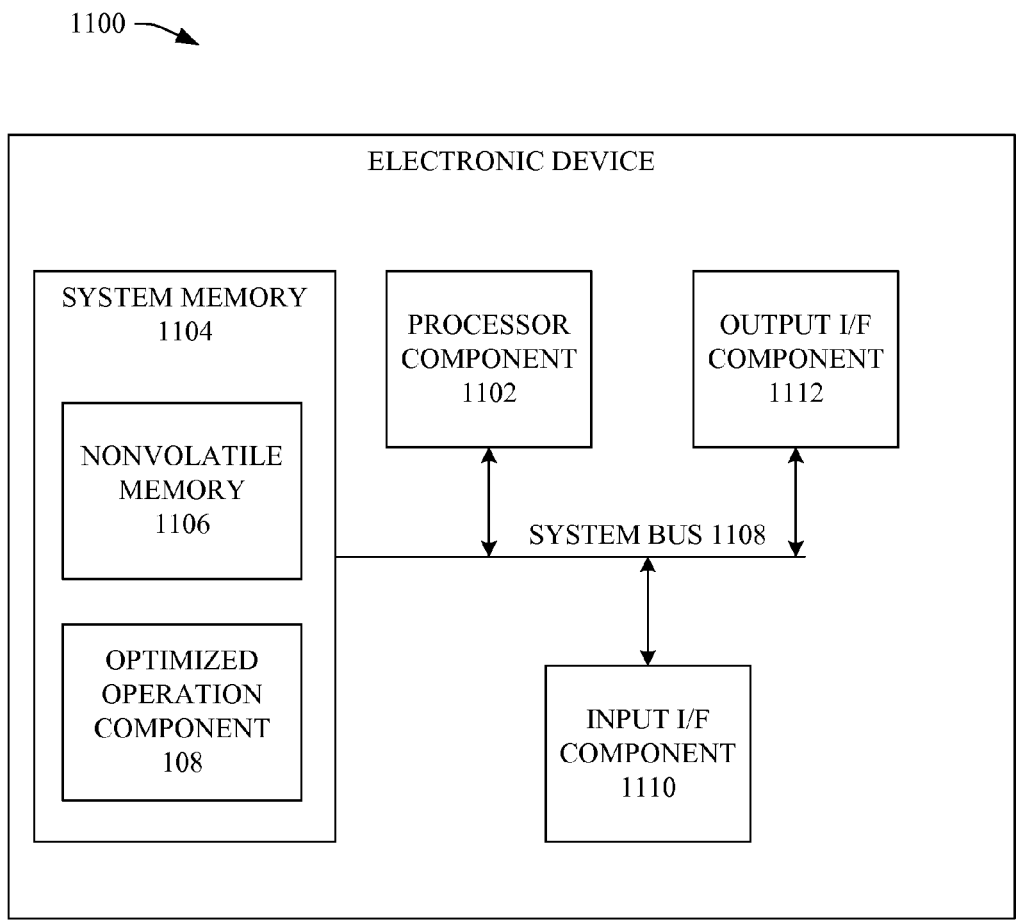
FIG. 11 is a block diagram of an exemplary, non-limiting electronic device that can employ a memory.

Referring to FIG. 11, illustrated is a block diagram of an exemplary, non-limiting electronic device 1100 that can comprise and/or incorporate system 100, system 400, memory device 500, portion of memory array 600, and/or system 700, or a respective portion(s) thereof, and/or implement methodology 800, methodology 900, and/or methodology 1000, or respective portions, aspects, or embodiments thereof. The electronic device 1100 can include, but is not limited to, a computer, a laptop computer, network equipment (e.g., routers, access points), a media player and/or recorder (e.g. audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like.

Components of the electronic device 1100 can include, but are not limited to, a processor component 1102 (e.g. which can be and/or can include the same or similar functionality as processor component 702, as depicted in FIG. 7 and described herein), a system memory 1104, which can contain a nonvolatile memory 1106, and a system bus 1108 that can couple various system components including the system memory 1104 to the processor component 1102. In one aspect, the system memory 1104 can be and/or can comprise the same or similar functionality as respective components (e.g., memory component 102, including the optimized operation component 108) as more fully described herein, for example, with regard to system 100, system 400, memory device 500, system 700, etc. For instance, the system memory 1104 can include the optimized operation component 108. In another aspect, the system bus 1108 can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Electronic device 1100 can typically include a variety of computer readable media. Computer readable media can be any available media that can be accessed by the electronic device 1100. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 1106 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1100. Communication media typically embodies computer readable instructions, data structures, program modules or other data in a modulated data signal such as a carrier wave or other transport mechanism and includes any information delivery media.

The system memory 1104 can include computer storage media in the form of volatile (e.g., SRAM) and/or nonvolatile memory 1106 (e.g. flash memory), where the nonvolatile memory 1106 can be removable media or non-removable media. A basic input/output system (BIOS), containing the basic routines that can facilitate transferring information between elements within electronic device 1100, such as during start-up, can be stored in the system memory 1104. The system memory 1104 typically also can contain data and/or program modules that can be accessible to and/or presently be operated on by the processor component 1102. By way of example, and not limitation, the system memory 1104 can also include an operating system(s), application programs, other program modules, and program data.

The nonvolatile memory 1106 can be removable or non-removable. For example, the nonvolatile memory 1106 can be in the form of a removable memory card or a USB flash drive. In accordance with one aspect, the nonvolatile memory 1106 can include flash memory (e.g., single-bit flash memory, multi-bit flash memory), ROM, PROM, EPROM, EEPROM, or NVRAM (e.g., FeRAM), or a combination thereof, for example. Further, a flash memory can comprise NOR flash memory and/or NAND flash memory.

A user can enter commands and information into the electronic device 1100 through input devices (not shown) such as a keypad, microphone, tablet, or touch screen although other input devices can also be utilized. These and other input devices can be connected to the processor component 1102 through input interface component 1110 that can be connected to the system bus 1108. Other interface and bus structures, such as a parallel port, game port or a universal serial bus (USB) can also be utilized. A graphics subsystem (not shown) can also be connected to the system bus 1108. A display device (not shown) can be also connected to the system bus 1108 via an interface, such as output interface component 1112, which can in turn communicate with video memory. In addition to a display, the electronic device 1100 can also include other peripheral output devices such as speakers (not shown), which can be connected through output interface component 1112.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, can refer to a computer-related entity, either hardware, software (e.g. in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein can encompass a computer program accessible from any computer-readable device, carrier, or media. For example, computer readable media can include, but is not limited to, magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that improves operations in a memory component, comprising:
    the memory component comprising a plurality of storage locations to facilitate data storage;
    an optimized operation component that facilitates application of a predefined negative gate voltage to wordlines adjacent to at least one wordline associated with at least one storage location selected for at least one of a read operation or a verify operation to facilitate reduction of disturb in the at least one storage location; and
    an evaluator component that monitors, measures, and evaluates at least one of an amount of adjacent wordline disturb, an amount of shift in a threshold voltage level associated with at least one data level in the at least one storage location, or an amount of shift in a drain-source current level associated with the at least one storage location.

2. The system of claim 1, further comprising:
    a selection component that facilitates application of the predefined negative gate voltage to the wordlines adjacent to the at least one wordline associated with the at least one storage location and a respective predefined gate voltage, a respective predefined drain voltage, and a respective predefined source voltage to the at least one storage location to facilitate performance of the at least one of the read operation or the verify operation.

3. The system of claim 1, wherein application of the predefined negative gate voltage to the wordlines adjacent to the at least one wordline associated with the at least one storage location facilitates reduction in an amount of shift in at least one threshold voltage level associated with the at least one storage location to facilitate reading or verifying data stored in the at least one storage location.

4. The system of claim 1, the optimized operation component determines whether at least one of the amount of adjacent wordline disturb, the amount of shift in a threshold voltage level associated with at least one data level in the at least one storage location, or the amount of shift in a drain-source current level associated with the at least one storage location respectively meets or exceeds a predetermined threshold amount of adjacent wordline disturb, a predetermined threshold amount of shift in the threshold voltage level, or a predetermined threshold amount of shift in the drain-source current.

5. The system of claim 4, the optimized operation component modifies the predefined negative gate voltage to a new negative gate voltage when it is determined that at least one of the amount of adjacent wordline disturb, the amount of shift in a threshold voltage level associated with at least one data level in the at least one storage location, or the amount of shift in a drain-source current level associated with the at least one storage location respectively meets or exceeds a predetermined threshold amount of adjacent wordline disturb, a predetermined threshold amount of shift in the threshold voltage level, or a predetermined threshold amount of shift in the drain-source current, to facilitate reducing at least one of the amount of adjacent wordline disturb, the amount of shift in a threshold voltage level associated with at least one data level in the at least one storage location, or the amount of shift in a drain-source current level associated with the at least one storage location.

6. The system of claim 5, the optimized operation component applies the new negative gate voltage to wordlines adjacent to at least one wordline associated with at least one storage location selected for at least one of a read operation or a verify operation.

7. The system of claim 1, further comprising:
    an intelligent component that evaluates at least one of current or historical information and infers at least one automated function to be performed by the optimized operation component based at least in part on the at least one of current or historical information.

8. The system of claim 7, the intelligent component infers at least one of the predefined negative gate voltage is to be modified to a disparate negative gate voltage or a frequency of evaluating adjacent wordline disturb, threshold voltage shift, or drain-source current shift, associated with the at least one storage location is to be increased so that the at least one storage location is evaluated more frequently to determine whether the predefined negative gate voltage is to be modified in order to facilitate modifying the negative gate voltage applied to adjacent wordlines during the at least one of a read operation or a verify operation to facilitate a reduction in at least one of an amount of adjacent wordline disturb, an amount of shift in a threshold voltage level associated with at least one data level in the at least one storage location, or an amount of shift in a drain-source current level associated with the at least one storage location.

9. A system that improves operations in a memory component, comprising:
    the memory component comprising a plurality of storage locations to facilitate data storage;
    an optimized operation component that facilitates application of a predefined negative gate voltage to wordlines adjacent to at least one wordline associated with at least one storage location selected for at least one of a read operation or a verify operation to facilitate reduction of disturb in the at least one storage location; and
    a storage component that stores information related to at least one of setting, adjusting, or applying a predefined negative gate voltage to wordlines adjacent to the at least one wordline associated with the at least one storage location during the at least one of a read operation or verify operation on the at least one storage location.

10. An electronic device comprising the system of claim 1.

11. The electronic device of claim 10, the electronic device is one of a computer, a cellular phone, a digital phone, a video device, a smart card, a personal digital assistant, a television, an electronic game, a digital camera, an electronic organizer, an audio player, an audio recorder, an electronic device associated with digital rights management, a Personal Computer Memory Card International Association (PCMCIA) card, a trusted platform module (TPM), an electronic control unit associated with a motor vehicle, a global positioning satellite (GPS) device, an electronic device associated with an airplane, an electronic device associated with an industrial control system, a Hardware Security Module (HSM), a set-top box, a secure memory device with computational capabilities, or an electronic device with at least one tamper-resistant chip.

12. A method for improving operations in a memory, comprising:
applying a predefined negative gate voltage to at least one wordline adjacent to at least one selected wordline associated with at least one memory cell selected for at least one of a read operation or verify operation to facilitate reducing a shift in voltage threshold associated with a data state of the at least one selected memory cell in the memory; and
applying a respective predefined gate voltage, predefined drain voltage, and predefined source voltage to the at least one selected memory cell to facilitate performing the at least one of a read operation or a verify operation to facilitate reading or verifying data stored in the at least one selected memory cell based at least in part on a received read command or verify command;
monitoring at least one of an amount of adjacent wordline disturb, an amount of shift in a threshold voltage level associated with the at least one selected memory cell, or an amount of shift in a drain-source current level associated with the at least one selected memory cell; and
evaluating the at least one of the amount of adjacent wordline disturb, the amount of shift in a threshold voltage level associated with the at least one selected memory cell, or the amount of shift in a drain-source current level associated with the at least one selected memory cell.

13. The method of claim 12, further comprising:
selecting the at least one selected memory cell to perform at least one the read operation or the verify operation based at least in part on at least one of a received read command or a received verify command; and
selecting the at least one wordline adjacent to at least one wordline associated with the at least one selected memory cell to facilitate applying the predefined negative gate voltage to the at least one wordline adjacent to the at least one selected wordline.

14. The method of claim 12, further comprising:
determining whether at least one of the at least one of the amount of adjacent wordline disturb, the amount of shift in a threshold voltage level associated with the at least one selected memory cell, or the amount of shift in a drain-source current level associated with the at least one selected memory cell meets or exceeds a respective predetermined threshold amount.

15. The method of claim 14, further comprising:
adjusting the predefined negative gate voltage applied to at least one wordline adjacent to at least one selected wordline associated with at least one memory cell selected for at least one of a read operation or verify operation to a specified disparate negative gate voltage when at least one of the amount of adjacent wordline disturb, the amount of shift in a threshold voltage level associated with the at least one selected memory cell, or the amount of shift in a drain-source current level associated with the at least one selected memory cell meets or exceeds a respective predetermined threshold amount.

16. The method of claim 15, further comprising:
applying the specified disparate negative gate voltage to at least one wordline adjacent to at least one selected wordline associated with at least one memory cell selected for at least one of a read operation or verify operation.

17. The system of claim 9, further comprising:
a selection component that facilitates application of the predefined negative gate voltage to the wordlines adjacent to the at least one wordline associated with the at least one storage location and a respective predefined gate voltage, a respective predefined drain voltage, and a respective predefined source voltage to the at least one storage location to facilitate performance of the at least one of the read operation or the verify operation.

18. The system of claim 9, wherein application of the predefined negative gate voltage to the wordlines adjacent to the at least one wordline associated with the at least one storage location facilitates reduction in an amount of shift in at least one threshold voltage level associated with the at least one storage location to facilitate reading or verifying data stored in the at least one storage location.

19. The system of claim 9, further comprising:
an intelligent component that evaluates at least one of current or historical information and infers at least one automated function to be performed by the optimized operation component based at least in part on the at least one of current or historical information.

20. An electronic device comprising the system of claim 9.

* * * * *